United States Patent
Jain et al.

(10) Patent No.: US 12,512,790 B2
(45) Date of Patent: Dec. 30, 2025

(54) OUTPUT COMMON-MODE CONTROL LOOP FOR FAST AND SMOOTH TRANSITION IN MULTI-MODE AMPLIFIERS

(71) Applicant: Cirrus Logic International Semiconductor Ltd., Edinburgh (GB)

(72) Inventors: Nishant Jain, Austin, TX (US); Vamsikrishna Parupalli, Austin, TX (US); Gaurav Agarwal, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 264 days.

(21) Appl. No.: 18/475,480

(22) Filed: Sep. 27, 2023

(65) Prior Publication Data

US 2024/0186950 A1 Jun. 6, 2024

Related U.S. Application Data

(60) Provisional application No. 63/429,728, filed on Dec. 2, 2022.

(51) Int. Cl.
*H03F 1/02* (2006.01)
*H03F 3/217* (2006.01)
*H03F 3/45* (2006.01)

(52) U.S. Cl.
CPC .............. *H03F 1/02* (2013.01); *H03F 3/217* (2013.01); *H03F 3/45071* (2013.01); *H03F 2200/129* (2013.01); *H03F 2200/414* (2013.01)

(58) Field of Classification Search
CPC ........ H03F 1/02; H03F 3/217; H03F 3/45071; H03F 2200/129; H03F 2200/414; H03F 2200/351; H03F 3/45941; H03F 3/45475; H03F 1/3211; H03F 3/2173

USPC ........................................ 330/251, 207 A, 10
See application file for complete search history.

(56) References Cited

U.S. PATENT DOCUMENTS

| | | | | |
|---|---|---|---|---|
| 6,023,143 A | * | 2/2000 | Salina | H02P 7/29 318/560 |
| 6,995,537 B1 | | 2/2006 | Plutowski et al. | |
| 8,207,695 B2 | * | 6/2012 | Galbiati | H02M 7/53871 318/400.29 |
| 10,911,009 B2 | * | 2/2021 | Hogan | H04R 3/00 |

FOREIGN PATENT DOCUMENTS

WO 2018191119 A2 10/2018

OTHER PUBLICATIONS

Combined Search and Examination Report under Sections 17 and 18(3), UKIPO, Application No. GB2317767.8, dated May 21, 2024.

* cited by examiner

*Primary Examiner* — Hieu P Nguyen
(74) *Attorney, Agent, or Firm* — Jackson Walker L.L.P.

(57) ABSTRACT

A system may include a pulse-width modulation mode path configured to drive a load at an output of the system in a first mode of operation, a linear mode path configured to drive the load in a second mode of operation, a common mode control feedback loop configured to set a value of a common mode output signal at the output in the second mode of operation, and an auxiliary circuit coupled to the common mode feedback control loop and configured to maintain a state of the common mode feedback control loop during the first mode of operation as the state was or will be during the second mode of operation.

10 Claims, 3 Drawing Sheets

OUTPUT COMMON-MODE CONTROL LOOP FOR FAST AND SMOOTH TRANSITION IN MULTI-MODE AMPLIFIERS

RELATED APPLICATION

The present disclosure claims priority to U.S. Provisional Patent Application Ser. No. 63/429,728, filed Dec. 2, 2022, which is incorporated by reference herein in its entirety.

FIELD OF DISCLOSURE

The present disclosure relates in general to electronic devices, and more particularly, to closed loop control in circuits driving an output current signal, including camera modules and other electronic circuits.

BACKGROUND

Many traditional mobile devices (e.g., mobile phones) include amplifiers for use in circuits such as audio circuits, camera controllers, and other circuits. An amplifier may have multiple modes of operation, for example a pulse width modulation (PWM) mode, which may be used for better efficiency, and a linear mode which may be used for lower output noise. A multi-mode amplifier may switch between its modes on the fly in order to generate desired behavior. One challenge in implementing multi-mode amplifiers is preventing mode switching artifacts, in order to minimize signal overshoot and undershoot of the output driven by an amplifier. Controlling a common mode of the amplifier output during mode switching may minimize such switching artifacts, but controlling output common mode during transitions between modes is challenging.

For example, in the linear mode of operation, the output common mode can be set using a feed-forward scheme or a feedback scheme. Using a negative feedback scheme may be particularly advantageous as it may provide better control, improved power supply rejection ratio, and/or other advantages. However, in the PWM mode of operation, the output common mode may vary based on the type of PWM implemented (e.g., single ended versus differential operation, Class-AD modulation versus Class-BD modulation, etc.).

SUMMARY

In accordance with the teachings of the present disclosure, the disadvantages and problems associated with controlling mechanical components in a camera module and other current-driven loads may be reduced or eliminated.

In accordance with embodiments of the present disclosure, a system may include a pulse-width modulation mode path configured to drive a load at an output of the system in a first mode of operation, a linear mode path configured to drive the load in a second mode of operation, a common mode control feedback loop configured to set a value of a common mode output signal at the output in the second mode of operation, and an auxiliary circuit coupled to the common mode feedback control loop and configured to maintain a state of the common mode feedback control loop during the first mode of operation as the state was or will be during the second mode of operation.

In accordance with these and other embodiments of the present disclosure, a method may be provided for a system including a pulse-width modulation mode path configured to drive a load at an output of the system in a first mode of operation, a linear mode path configured to drive the load in a second mode of operation, and a common mode control feedback loop configured to set a value of a common mode output signal at the output in the second mode of operation. The method may include maintaining, with an auxiliary circuit coupled to the common mode feedback control loop, a state of the common mode feedback control loop during the first mode of operation as the state was or will be during the second mode of operation.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
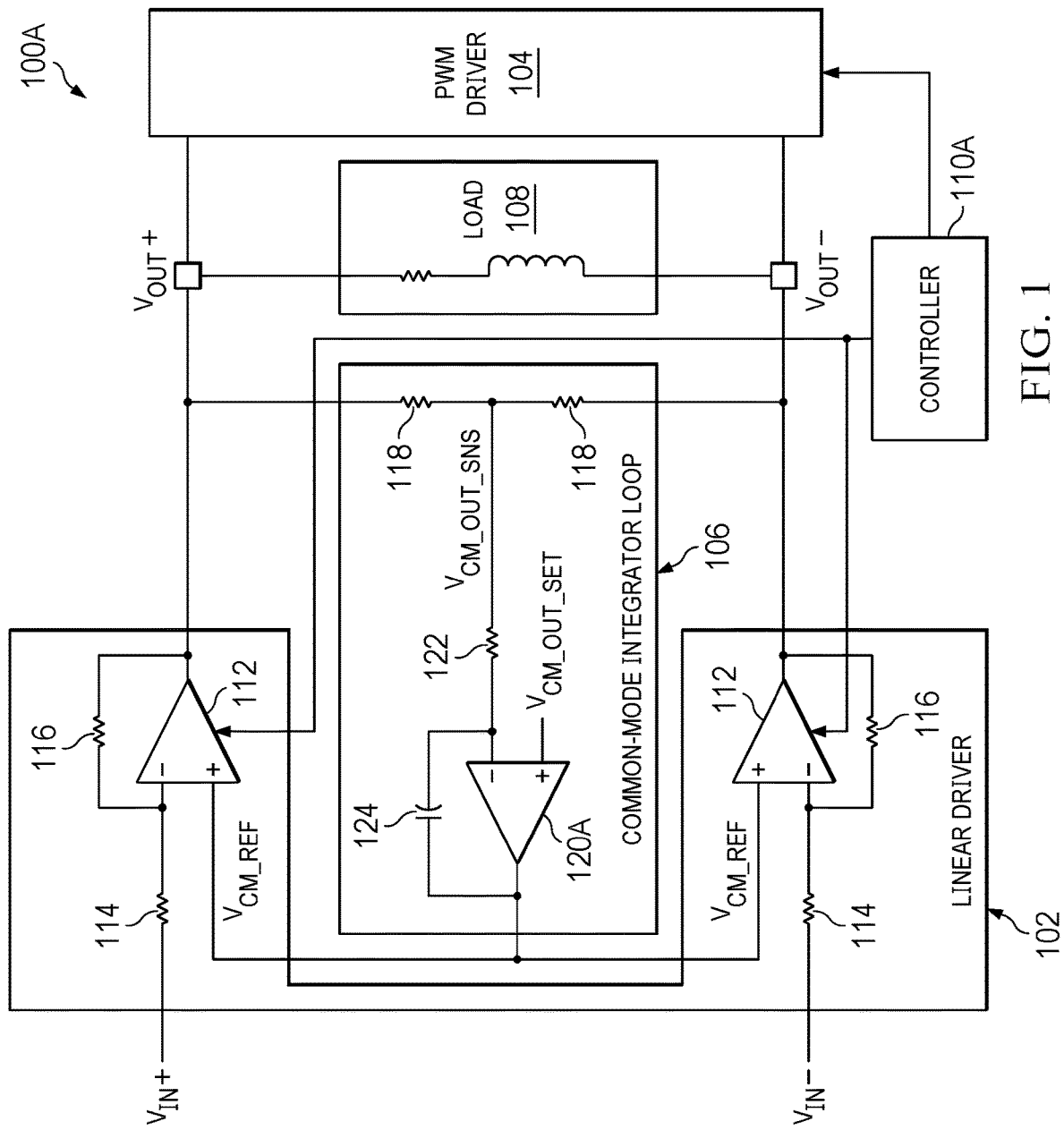
FIG. 1 illustrates a block diagram of selected components of an example multi-mode amplifier utilizing feedback output common-mode control during a pseudo-differential linear mode of operation, in accordance with embodiments of the present disclosure.

FIG. 1 illustrates a block diagram of selected components of an example multi-mode amplifier 100A utilizing feedback output common-mode control during a linear mode of operation of multi-mode amplifier 100A, in accordance with embodiments of the present disclosure. As shown in FIG. 1, multi-mode amplifier 100A may include a linear driver 102, a PWM driver 104, a common-mode integrator loop 106, a load 108, and a controller 110A.

Linear driver 102 may comprise a linear amplifier configured to receive a differential input signal $V_{IN}=V_{IN}^+-V_{IN}^-$ and apply a linear gain to differential input signal $V_{IN}$ to generate a differential output signal $V_{OUT}=V_{OUT}^+-V_{OUT}^-$ driven to load 108. As shown in FIG. 1, linear driver 102 may be implemented with a pair of operational amplifiers 112, wherein a first operational amplifier 112 is configured to receive positive polarity input signal $V_{IN}^+$ and generate positive polarity output signal $V_{OUT}^+$, and a second operational amplifier 112 is configured to receive negative polarity input signal $V_{IN}^-$ and generate negative polarity output signal $V_{OUT}^-$. Each operational amplifier 112 may be coupled at its inverting input to its respective polarity input signal via an input resistor 114, and may be coupled at its non-inverting input to a common-mode reference voltage $V_{CM\_REF}$ generated by common-mode integrator loop 106. Further, each operational amplifier 112 may have a feedback resistor 116 coupled between its output and its inverting input, such that a gain of linear driver 102 is equivalent to a ratio of a resistance value of feedback resistors 116 to a resistance value of input resistors 114.

PWM driver 104 may comprise any system, device, or apparatus configured to receive differential input signal $V_{IN}$ and generate a pulse-width modulated differential output signal $V_{OUT}$ having a pulse width which is a function of differential input signal $V_{IN}$. In some embodiments, PWM driver 104 may comprise a Class-D amplifier. One example of PWM driver 104 may be set forth in U.S. Pat. No. 11,115,046, which is incorporated by reference herein.

Common-mode integrator loop 106 may comprise any system, device, or apparatus configured to integrate a difference between a sensed output common mode voltage $V_{CM\_OUT\_SNS}$ and a desired output common mode output voltage $V_{CM\_OUT\_SET}$ to generate common-mode reference voltage $V_{CM\_REF}$ at its output which is driven to the non-inverting inputs of operational amplifiers 112 of linear driver 102. As shown in FIG. 1, common-mode integrator loop 106 may comprise a voltage divider in parallel with load 108 having sense resistors 118 with approximately equal resistances to generate sensed output common mode voltage $V_{CM\_OUT\_SNS}$ at an electrical node common to sense resistors 118. Common-mode integrator loop 106 may further be implemented with an operational amplifier 120A with its inverting input coupled to common mode voltage $V_{CM\_OUT\_SNS}$ via an input resistor 122, with its non-inverting input driven by desired output common mode output voltage $V_{CM\_OUT\_SET}$, and having an integrating capacitor 124 coupled between its inverting input and its output.

Load 108 may include any electrical, electronic, or electromechanical device. For example, load 108 may include a speaker, a motor, a haptic transducer, or other suitable device.

Controller 110A may include any system, device, or apparatus configured to control operations of linear driver 102 and PWM driver 104. In particular, controller 110A may be configured to selectively enable or disable linear driver 102 and PWM driver 104 based on the mode of operation of multi-mode amplifier 100A in either of the linear mode or the PWM mode. For example, in the linear mode of operation, controller 110A may disable switching in PWM driver 104 such that PWM driver 104 drives no signal to load 108. Similarly, in the PWM mode of operation, controller 110A may cause a very high output impedance for the outputs of operational amplifiers 112, such that linear driver 102 drives no signal to load 108.

One disadvantage of multi-mode amplifier 100A is that common-mode reference voltage $V_{CM\_REF}$ output by common-mode integrator loop 106 may saturate in the PWM mode, as the common-mode loop may be disconnected or broken in the PWM mode. Further, in the PWM mode, common-mode reference voltage $V_{CM\_REF}$ may vary by more than 5% of a supply voltage supplied to multi-mode amplifier 100A, particularly where Class-AD modulation or single-ended PWM operation is used. Accordingly, upon switching from the PWM mode to the linear mode, a load current flowing through load may substantially overshoot and/or undershoot before settling into steady state. Such disadvantage may be reduced or eliminated through the use of auxiliary circuits, as described below with reference to FIGS. 2 and 3.

Figure 2:
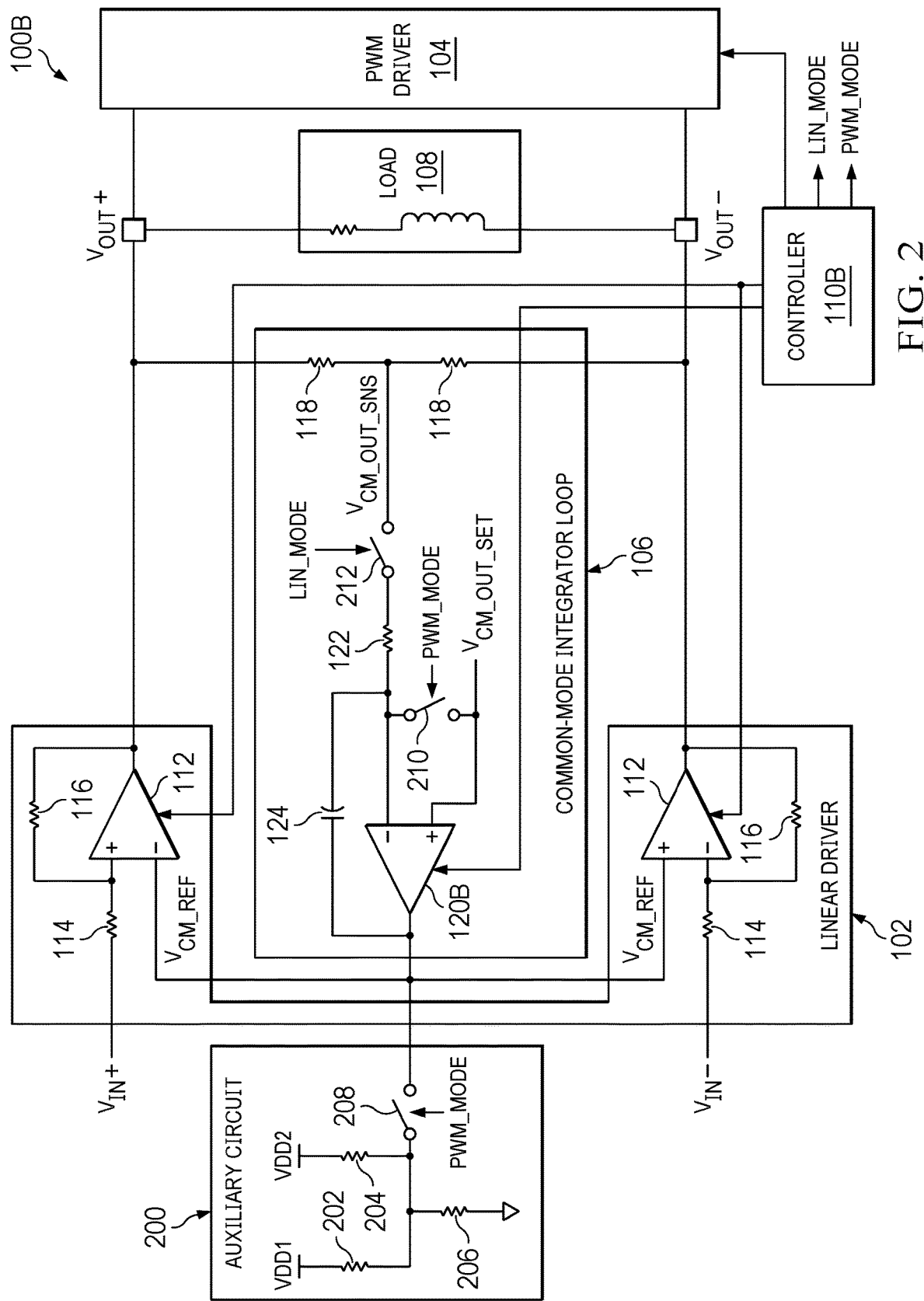
FIG. 2 illustrates a block diagram of selected components of an example multi-mode amplifier utilizing feedback output common-mode control during a pseudo-differential linear mode of operation and with feedforward control of the common-mode loop during mode transitions of the amplifier, in accordance with embodiments of the present disclosure.

FIG. 2 illustrates a block diagram of selected components of an example multi-mode amplifier 100B utilizing feedback output common-mode control during a linear mode of operation and with feedforward control of the common-mode loop of example multi-mode amplifier 100B using an auxiliary circuit 200 during mode transitions of example multi-mode amplifier 100B, in accordance with embodiments of the present disclosure. Multi-mode amplifier 100B depicted in FIG. 2 may be similar in many respects to multi-mode amplifier 100A depicted in FIG. 1, and thus, only the main differences between multi-mode amplifier 100A and multi-mode amplifier 100B may be described below.

One main difference between multi-mode amplifier 100A and multi-mode amplifier 100B is that multi-mode amplifier 100B may include auxiliary circuit 200 implementing feedforward control of the output of common-mode integrator loop 106 during transitions between the linear mode and the PWM mode. As shown in FIG. 2, auxiliary circuit 200 comprises a resistor divider comprising resistors 202, 204, and 206 arranged as shown, with resistors 202, 204, and 206 having a common node, resistor 202 coupled to a source voltage VDD1, resistor 204 coupled to a source voltage VDD2, and resistor 206 coupled to ground. In operation, voltages VDD1 and VDD2 and/or resistances of resistors 202, 204, and/or 206 may be controlled (e.g., by controller 110B or another suitable controller) such that a voltage at the common node of resistors 202, 204, and 206 is approximately equal to what the value of common-mode reference voltage $V_{CM\_REF}$ is or was (or would be) during the linear mode of operation. As shown in FIG. 2, auxiliary circuit 200 may also include a switch 208 configured to be closed (e.g., on, activated, enabled) during the PWM mode and open (e.g., off, deactivated, disabled) during the linear mode, such that the common node of resistors 202, 204, and 206 is coupled to the output of common-mode integrator loop 106 during the PWM mode and decoupled from the output of common-mode integrator loop 106 during the linear mode.

Multi-mode amplifier 100B may also include a switch 210 coupled between the terminals of operational amplifier 120B of multi-mode amplifier 100B, wherein switch 210 is configured to be closed during the PWM mode and open during the linear mode, such that the terminals of operational amplifier 120B are shorted together during the PWM mode and are decoupled from one another during the linear mode. Further, multi-mode amplifier 100B may include a switch 212 coupled between resistor 122 and the node common to resistors 118 and may be configured to be closed during the linear mode and open during the PWM mode, such that resistor 122 is coupled to the node common to resistors 118 in the linear mode and decoupled from the node common to resistors 118 in the PWM mode.

Controller 110B of multi-mode amplifier 100B may be similar to controller 110A of multi-mode amplifier 100A except that controller 110B may generate control signals for operating switches 208, 210, and 212, and may generate a control signal configured to cause a very high output impedance at the output of operational amplifier 120B, such that operational amplifier 120B drives no signal to its output.

In operation, during the linear mode of operation, switches 208 and 210 may be open and switch 212 may be closed, rendering multi-mode amplifier 100B in the linear mode functionally equivalent to multi-mode amplifier 100A in the linear mode. However, during the PWM mode, switch 210 may be closed and switch 212 may be open, decoupling the non-inverting input of operational amplifier 120B from the resistor divider of resistors 118 and shorting the non-inverting input (and thus one plate of integrating capacitor 124) to desired output common mode output voltage $V_{CM\_OUT\_SET}$. Further during the PWM mode, switch 208 may be closed, such that auxiliary circuit 200 drives a voltage on the other plate of integrating capacitor 124 approximately equal to the common-mode reference voltage $V_{CM\_REF}$ driven by that common-mode integrator loop 106 immediately prior to multi-mode amplifier 100B switching from the linear mode to the PWM mode. Thus, during the PWM mode, the voltage across integrating capacitor 124 may remain approximately equal to what it was (or would be) during the linear mode of operation. Accordingly, when multi-mode amplifier 100B again switches from the PWM mode to the linear mode, the feedback loop of linear driver 102 may already be close to convergence, thus reducing or eliminating the overshoot or undershoot conditions that may occur in multi-mode amplifier 100A on account of saturation of common-mode integrator loop 106 that may occur in multi-mode amplifier 100A.

Figure 3:
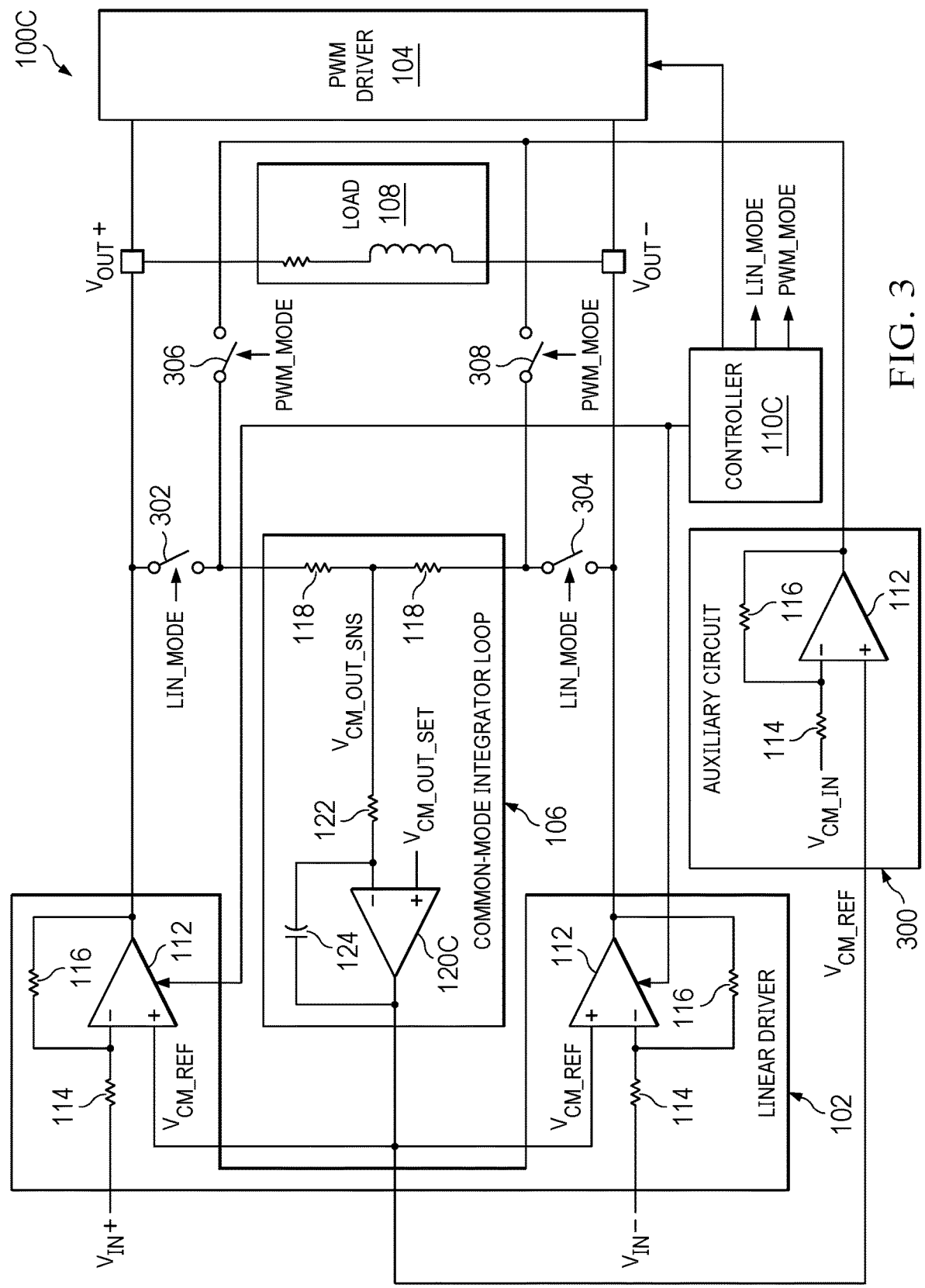
FIG. 3 illustrates a block diagram of selected components of an example multi-mode amplifier utilizing feedback output common-mode control during a pseudo-differential linear mode of operation and with feedback control of the common-mode loop during mode transitions of the amplifier, in accordance with embodiments of the present disclosure.

FIG. 3 illustrates a block diagram of selected components of an example multi-mode amplifier 100C utilizing feedback output common-mode control during a linear mode of operation and with feedback control of the common-mode loop of example multi-mode amplifier 100C using an auxiliary circuit 300 during mode transitions of example multi-mode amplifier 100C, in accordance with embodiments of the present disclosure. Multi-mode amplifier 100C depicted in FIG. 3 may be similar in many respects to multi-mode amplifier 100A depicted in FIG. 1, and thus, only the main differences between multi-mode amplifier 100A and multi-mode amplifier 100C may be described below.

One main difference between multi-mode amplifier 100A and multi-mode amplifier 100C is that multi-mode amplifier 100C may include auxiliary circuit 300 implementing feedback control of the output of common-mode integrator loop 106 during transitions between the linear mode and the PWM mode. As shown in FIG. 3, auxiliary circuit 300 may include an operational amplifier 112, input resistor 114, and feedback resistor 116 arranged as shown, thus forming as a replica of one-half of linear driver 102, with the non-inverting input of operational amplifier 112 of auxiliary circuit 300 coupled to a common-mode voltage $V_{CM\_IN}$ of input voltage $V_{IN}$. In some embodiments, operational amplifier 112, input resistor 114, and feedback resistor 116 may not be exactly the same as used for linear driver 102 (e.g., less expensive components may be used), so long as the gain, as defined by the ratio of feedback resistor 116 to input resistor 114, remains the same in auxiliary circuit 300 as it does in linear driver 102.

As also shown in FIG. 3, multi-mode amplifier 100C may also include a switch 302 coupled between a first sense resistor 118 and positive polarity output voltage $V_{OUT}^+$, a switch 304 coupled between a second sense resistor 118 and negative polarity output voltage $V_{OUT}^-$, a switch 306 coupled between the output of operational amplifier 112 and the node common to switch 302 and first sense resistor 118, and a switch 308 coupled between the output of operational amplifier 112 and the node common to switch 304 and second sense resistor 118. Switches 302 and 304 may be configured to be closed during the linear mode and open during the PWM mode and switches 306 and 308 may be configured to be closed during the PWM mode and open during the linear mode such that: (a) the input of common-mode integrator loop 106 is coupled to the output of linear driver 102 during the linear mode and decoupled from the output of linear driver 102 during the PWM mode; and (b) the input of common-mode integrator loop 106 is coupled to the output of auxiliary circuit 300 during the PWM mode and decoupled from the output of auxiliary circuit 300 during the linear mode.

Controller 110C of multi-mode amplifier 100C may be similar to controller 110A of multi-mode amplifier 100A except that controller 110C may generate control signals for operating switches 302, 304, 306, and 308.

In operation, during the linear mode of operation, switches 302 and 304 may be closed and switches 306 and 308 may be open, rendering multi-mode amplifier 100C in the linear mode functionally equivalent to multi-mode amplifier 100A in the linear mode. However, in the PWM mode, switches 302 and 304 may be open and switches 306 and 308 may be closed, such that auxiliary circuit 300 forms a replica of the common-mode control loop which may preserve the state of the common-mode control feedback loop as it was (or would be) during the linear mode. In other words, auxiliary circuit 300 may, together with common-mode integrator loop 106, create a replica of the common-mode loop which operates in the PWM mode to maintain common-mode integrator loop 106 in a similar state as it was (or would be) during the linear mode. Accordingly, when multi-mode amplifier 100C again switches from the PWM mode to the linear mode, the feedback loop of linear driver 102 may already be close to convergence, thus reducing or eliminating the overshoot or undershoot conditions that may occur in multi-mode amplifier 100A on account of saturation of common-mode integrator loop 106 that may occur in multi-mode amplifier 100A.

In accordance with embodiments of the present disclosure, systems and methods are provided wherein during a PWM mode of operation, a common-mode loop may be maintained in the same or a similar state as it is during a linear mode of operation. Such systems and methods may prevent common-mode integrator loop 106 from saturating in the PWM mode and may preserve the charge on a common-mode integrating capacitor 124 of common-mode integrator loop 106 in the PWM mode.

Embodiments of the present disclosure provide a system and method that comprises an output (e.g., load 108), a pulse width modulation mode path (e.g., PWM driver 104), a linear mode path (linear driver 102), a common-mode control feedback loop (common-mode integrator loop 106), and an auxiliary circuit (e.g., auxiliary circuit 200, auxiliary circuit 300). The pulse-width modulation mode path may drive the output in a first mode of operation (e.g., a PWM mode of operation) and the linear mode path may drive the output in a second mode of operation (e.g., a linear mode of operation). The common-mode control feedback loop may set a value of the common-mode output in the linear mode. The auxiliary circuit may be coupled to the common-mode feedback loop and may maintain a state of the common-mode control feedback loop during the first mode of operation as it was (or would be) during the second mode of operation. Accordingly, the auxiliary circuit may lead to a faster and smoother transition between the first mode of operation and the second mode of operation.

In some embodiments, the auxiliary circuit may be a feedforward circuit which preserves a charge on an integrating capacitor of an integrator of the common-mode control feedback loop during the first mode of operation as it was (or would be) during the second mode of operation. In other embodiments, the auxiliary circuit may form a replica of the common-mode control feedback loop during the first mode of operation which may preserve the state of the common mode control feedback loop as it was (or would be) during the second mode of operation.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    a pulse-width modulation mode path configured to drive a load at an output of the system in a first mode of operation;
    a linear mode path configured to drive the load in a second mode of operation;
    a common mode control feedback loop configured to set a value of a common mode output signal at the output in the second mode of operation; and
    an auxiliary circuit coupled to the common mode control feedback loop and configured to maintain a state of the common mode control feedback loop during the first mode of operation as the state was or would be during the second mode of operation.

2. The system of claim 1, wherein the auxiliary circuit is a feedforward circuit configured to preserve a charge on an integrating capacitor of an integrator of the common mode control feedback loop during the first mode of operation as the charge was or will be during the second mode of operation.

3. The system of claim 1, wherein the auxiliary circuit, together with the common mode control feedback loop, forms a replica of a common mode control feedback loop during the first mode of operation which preserves the state of the common mode control feedback loop during the first mode of operation as the state was or would be during the second mode of operation.

4. The system of claim 1, wherein the pulse-width modulation mode path comprises a Class-D amplifier.

5. The system of claim 1, wherein the common mode output signal varies by more than 5% in the first mode of operation.

6. A method comprising, in a system including a pulse-width modulation mode path configured to drive a load at an output of the system in a first mode of operation, a linear mode path configured to drive the load in a second mode of operation, and a common mode control feedback loop configured to set a value of a common mode output signal at the output in the second mode of operation:
    maintaining, with an auxiliary circuit coupled to the common mode control feedback loop, a state of the common mode control feedback loop during the first mode of operation as the state was or would be during the second mode of operation.

7. The method of claim 6, wherein the auxiliary circuit is a feedforward circuit configured to preserve a charge on an integrating capacitor of an integrator of the common mode control feedback loop during the first mode of operation as the charge was or will be during the second mode of operation.

8. The method of claim 6, wherein the auxiliary circuit, together with the common mode control feedback loop, forms a replica of a common mode feedback loop during the first mode of operation which preserves the state of the common mode control feedback loop during the first mode of operation as the state was or would be during the second mode of operation.

9. The method of claim 6, wherein the pulse-width modulation mode path comprises a Class-D amplifier.

10. The method of claim 6, wherein the common mode output signal varies by more than 5% in the first mode of operation.

* * * * *